United States Patent
Feng et al.

(10) Patent No.: US 9,343,632 B2
(45) Date of Patent: May 17, 2016

(54) ENCAPSULATION HOUSING AND LED MODULE WITH THE SAME

(75) Inventors: Yaojun Feng, Shenzhen Guangdong (CN); Yuanyuan He, Shenzhen Guangdong (CN); Yubao He, Shenzhen Guangdong (CN); Canbang Yang, Shenzhen Guangdong (CN)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/124,255

(22) PCT Filed: May 11, 2012

(86) PCT No.: PCT/EP2012/058802
§ 371 (c)(1),
(2), (4) Date: Dec. 6, 2013

(87) PCT Pub. No.: WO2012/168031
PCT Pub. Date: Dec. 13, 2012

(65) Prior Publication Data
US 2014/0124824 A1    May 8, 2014

(30) Foreign Application Priority Data
Jun. 7, 2011 (CN) .......................... 2011 1 0151093

(51) Int. Cl.
*H01L 33/48* (2010.01)
*F21V 15/01* (2006.01)
*B29C 65/54* (2006.01)
*B29C 65/00* (2006.01)
*H05K 3/28* (2006.01)

(52) U.S. Cl.
CPC .............. *H01L 33/483* (2013.01); *F21V 15/01* (2013.01); *H01L 33/486* (2013.01); *B29C 65/54* (2013.01); *B29C 66/322* (2013.01); *B29C 66/342* (2013.01); *B29C 66/54* (2013.01); *H01L 2924/0002* (2013.01); *H05K 3/284* (2013.01); *H05K 2201/10106* (2013.01); *H05K 2203/1316* (2013.01)

(58) Field of Classification Search
CPC ............................. H01L 33/48; H01L 51/5272
USPC ........................................................ 257/678
See application file for complete search history.

(56) References Cited

U.S. PATENT DOCUMENTS

| 8,546,841 B2 | 10/2013 | Matoba et al. |
| 2008/0029775 A1 | 2/2008 | Liu et al. |

(Continued)

FOREIGN PATENT DOCUMENTS

| CN | 101162750 A | 4/2008 |
| CN | 102074638 A | 5/2011 |
| JP | 2003037292 A | 2/2003 |

(Continued)

OTHER PUBLICATIONS

English language abstract of JP 2010221572 A of Oct. 7, 2010.
(Continued)

*Primary Examiner* — Mohammad Choudhry
(74) *Attorney, Agent, or Firm* — Viering, Jentschura & Partner mbB

(57) ABSTRACT

An encapsulation housing for a LED module, may include an upper housing and a lower housing joined together and defining together a cavity, wherein at least one of the upper housing and the lower housing has an inner partition wall partitioning the cavity into an assembly cavity and an anti-leakage cavity encircling the assembly cavity.

14 Claims, 3 Drawing Sheets

(56) References Cited

U.S. PATENT DOCUMENTS

2008/0315235 A1\* 12/2008 Murazaki ........................ 257/98
2011/0024627 A1    2/2011 Yao

FOREIGN PATENT DOCUMENTS

| | | | |
|---|---|---|---|
| JP | 2007188832 | A | 7/2007 |
| JP | 2010221572 | A | 10/2010 |
| WO | 2011013581 | A1 | 2/2011 |

OTHER PUBLICATIONS

English language abstract of JP 2003037292 A of Feb. 7, 2003.
English language abstract of JP 2007188832 A of Jul. 26, 2007.
Chinese Office Action based on Application No. 201110151093.4 (6 Pages and 6 pages of English translation) Dated Nov. 26, 2015.

\* cited by examiner

ENCAPSULATION HOUSING AND LED MODULE WITH THE SAME

RELATED APPLICATIONS

This application is a national stage entry according to 35 U.S.C. §371 of PCT application No.: PCT/EP2012/058802 filed on May 11, 2012, which claims priority from Chinese application No.: 201110151093.4 filed on Jun. 7, 2011.

TECHNICAL FIELD

Various embodiments relate to an encapsulation housing for a LED module and a LED module with said encapsulation housing.

BACKGROUND

In an existing illumination device, a low power LED module is usually used as alight source. In a general case, when this type of illumination device is applied in an outdoor environment, the requirement for a certain level of IP protection needs to be met. In order to achieve a good protection, one solution in the prior art is to use a single-side potting method, viz. a PCB board loaded with a LED chip is first placed in a half housing of a housing, the other half housing is then joined with said half housing to form an integral housing, later, a potting glue is pot into the housing via an potting hole formed on one half housing, and air is discharged from an exhaust hole also formed on said half housing. After the potting glue gets solid, the housing achieves a better protection effect to meet the requirement for the level of IP protection. However, the drawback of this method lies in that, the potting glue may leak from the slim between the two half housings, and the leaking potting glue has a negative effect on the aesthetic properties of the housing. If the potting glue in the slim is pull off after getting solid, it will possibly results in a decrease in the leakproofness of the housing, which affects the IP protection effect adversely. Another solution in the prior art is that two housing members are welded together via ultrasonic welding after being joined together, which obtains favorable leakproofness. However, the high frequency vibration of ultrasonic might damage the LED chip.

SUMMARY

In order to overcome the above defect, various embodiments provide an encapsulation housing for a LED module and a LED module with said type of encapsulation housing.

Various embodiments provide one type of encapsulation housing for a LED module, viz. said encapsulation housing has an upper housing and a lower housing joined together and defining together a cavity, wherein at least one of the upper housing and the lower housing has an inner partition wall partitioning the cavity into an assembly cavity and an anti-leakage cavity encircling the assembly cavity. By using the encapsulation housing according to the present disclosure for encapsulating the LED module, potting glue is pot into the assembly cavity. During potting process, potting glue possibly leaking out from the inner partition wall flows into the anti-leakage cavity rather than out of the encapsulation housing, thereby obtaining a good appearance while ensuring meeting the requirement for the level of IP protection.

According to one preferred design solution of the present disclosure, the upper housing has a first bottom wall and the lower housing has a second bottom wall, the inner partition wall consists of a first inner partition wall portion extending from the first bottom wall and a second inner partition wall portion extending from the second bottom wall of the lower housing, and the contact surfaces of the first inner partition wall portion and the second inner partition wall portion form a first anti-leakage surface extending from the assembly cavity to the anti-leakage cavity. Said inner partition wall prevents the leakage of the potting glue to a great extent. Moreover, the possibly leaking potting glue is received by the anti-leakage cavity.

As provided according to the present disclosure, at least one of the upper housing and the lower housing further has a lateral wall extending from the first bottom wall and/or the second bottom wall, such that the upper housing and the lower housing join together to form the cavity. Said lateral wall further prevents the potting glue entering the anti-leakage cavity from leaking out of the encapsulation housing.

Preferably, the lateral wall consists of a first lateral wall portion formed on the upper housing and a second lateral wall portion formed on the lower housing, and contact surfaces of the first lateral wall portion and the second lateral wall portion form a second anti-leakage surface extending from the anti-leakage cavity to ambient environment. In the design solution of the present disclosure, the upper housing and the lower housing may both have lateral wall portions which form together an integral lateral wall. Of course, the upper housing or the lower housing may independently have an integral lateral wall.

As provided according to one preferred design solution of the present disclosure, the second anti-leakage surface is higher than the first anti-leakage surface. Since the second anti-leakage surface is higher than the first anti-leakage surface, the potting process might have already been ended before the potting glue possibly leaking into the anti-leakage cavity reaches the second anti-leakage surface, which further prevents the potting glue from leaking into ambient environment outside the encapsulation housing.

As provided according to the present disclosure, a potting hole and an exhaust hole respectively penetrating into the assembly cavity are formed on the second bottom wall of the lower housing. By potting the potting glue into the potting hole, air is discharged from the exhaust hole, such that the potting glue is pot uniformly into the inside of the assembly cavity without forming bubbles therein.

Preferably, the second anti-leakage surface is higher than a lower surface of the assembly cavity, said lower surface being a surface of the second bottom wall of the lower housing provided with the potting hole and the exhaust hole and defining the assembly cavity. Thus, when the assembly cavity is filled up with the potting glue, the potting glue possibly leaking out will not reach the second anti-leakage surface, thereby preventing the potting glue from leaking out of the encapsulation housing.

The technical term "higher" mentioned in the design solution of the present disclosure shall be understood as follows, viz. when potting the assembly cavity with the potting glue, the height of liquid level of the potting glue is taken as a reference criterion. When the assembly cavity is filled up with the potting glue, the liquid level of the potting glue reaches the surface of the second bottom wall of the lower housing provided with the potting hole and the exhaust hole and defining the assembly cavity. Therefore, the heights of the first anti-leakage surface and the second anti-leakage surface shall be understood as the heights relative to the liquid level of the potting glue.

As provided according to one preferred design solution of the present disclosure, the first lateral wall portion or the second lateral wall portion is provided with a recess part, and the second lateral wall portion or the first lateral wall portion is provided with a protrusion part shaped to adaptively engage the recess part. Such a design solution remarkably increases the area of the first anti-leakage surface, thereby improving effectively the anti-leakage capability of the first anti-leakage surface.

As provided according to the present disclosure, a lateral wall guide wire hole and an inner partition wall guide wire hole are formed on the lateral wall and the inner partition wall, respectively, and the lateral wall guide wire hole and the inner partition wall guide wire hole have a cross section corresponding to the cross section of the guide wire, respectively. Preferably, the cross sections of the lateral wall guide wire hole and the inner partition wall guide wire hole are slightly smaller than that of the guide wire, such that a tight engagement is achieved between the guide wire and the guide wire hole to prevent the potting glue from leaking out of the guide wire hole. Further preferably, the lateral wall guide wire hole is formed by joining the recesses which are respectively formed on the contact surfaces of the first lateral wall portion and the second lateral wall portion, and the inner partition wall guide wire hole is formed by joining the recesses which are respectively formed on the contact surfaces of the first inner partition wall portion and the second inner portion wall portion.

Preferably, the first lateral wall portion or the second lateral wall portion has a fixing channel, and the second lateral wall portion or the first lateral wall portion has a fixing hook fixable into the fixing channel for firmly connecting the upper housing and the lowing housing together.

Another object of the present disclosure is realized by one type of LED module. Said LED module has the above type of encapsulation housing. The LED module according to the present disclosure can meet the requirement for the level of IP protection while obtaining a good appearance.

BRIEF DESCRIPTION OF THE DRAWINGS

In the drawings, like reference characters generally refer to the same parts throughout the different views. The drawings are not necessarily to scale, emphasis instead generally being replaced upon illustrating the principles of the disclosure. In the following description, various embodiments of the disclosure are described with reference to the following drawings, in which.

DETAILED DESCRIPTION

The following detailed description refers to the accompanying drawings that show, by way of illustration, specific details and embodiments in which the disclosure may be practiced.

Figure 1:
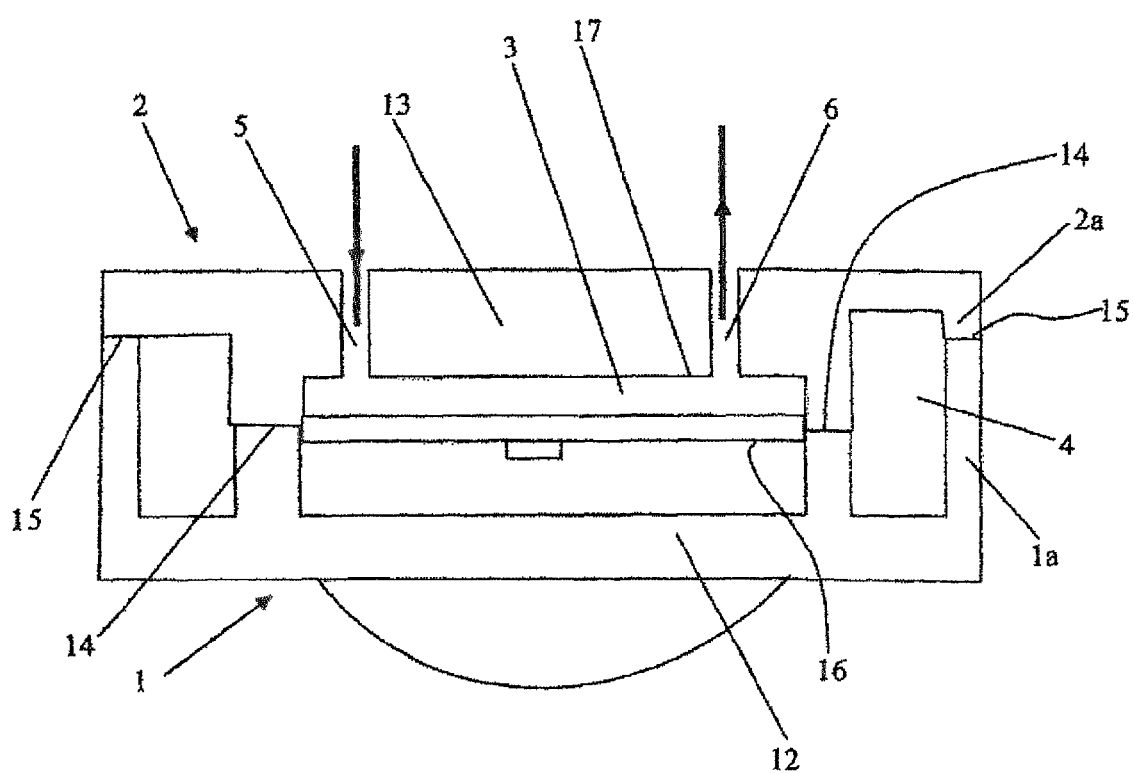
FIG. 1 is a sectional view of an encapsulation housing according to the present disclosure.

FIG. 1 is a sectional view of an encapsulation housing according to the present disclosure. As can be seen from the figure, said encapsulation housing has an upper housing 1 and a lower housing 2. The upper housing 1 has a first bottom wall 12 and the lower housing 2 has a second bottom wall 13, respectively, wherein the upper housing 1 and the lower housing 2 abuts against each other via the lateral walls extending from the first bottom wall 12 and the second bottom wall 13 and define together a cavity.

At least one of the upper housing 1 and the lower housing 2 further has an inner partition wall partitioning a cavity into an assembly cavity 3 for receiving a PCB board 16 provided with a LED chip of a LED module and an anti-leakage cavity 4 encircling the assembly cavity 3. In this embodiment, the inner partition wall consists of a first inner partition wall portion 1b extending from the first bottom wall 12 of the upper housing 1 and a second inner partition wall portion 2b extending from the second bottom wall 13 of the lower housing 2, and the contact surfaces of the first inner partition wall portion 1b and the second inner partition wall portion 2b form a first anti-leakage surface 14 extending from the assembly cavity 3 to the anti-leakage cavity 4. In this embodiment, the lateral wall consists of a first lateral wall portion 1a formed on the upper housing 1 and a second lateral wall portion 2a formed on the lower housing 2, and contact surfaces of the first lateral wall portion 1a and the second lateral wall portion 2a form a second anti-leakage surface 15 extending from the anti-leakage cavity 15 to ambient environment. In addition, as can be seen from FIG. 1, the second anti-leakage surface 15 is higher than the first anti-leakage surface 14.

A potting hole 5 and an exhaust hole 6 respectively penetrating into the assembly cavity 3 are formed on the lower housing 2, and the second anti-leakage surface is higher than a lower surface 17 of the assembly cavity 3, said lower surface 17 being a surface of the second bottom wall 13 of the lower housing 2 provided with the potting hole 5 and the exhaust hole 6 and defining the assembly cavity 3.

Figure 2:
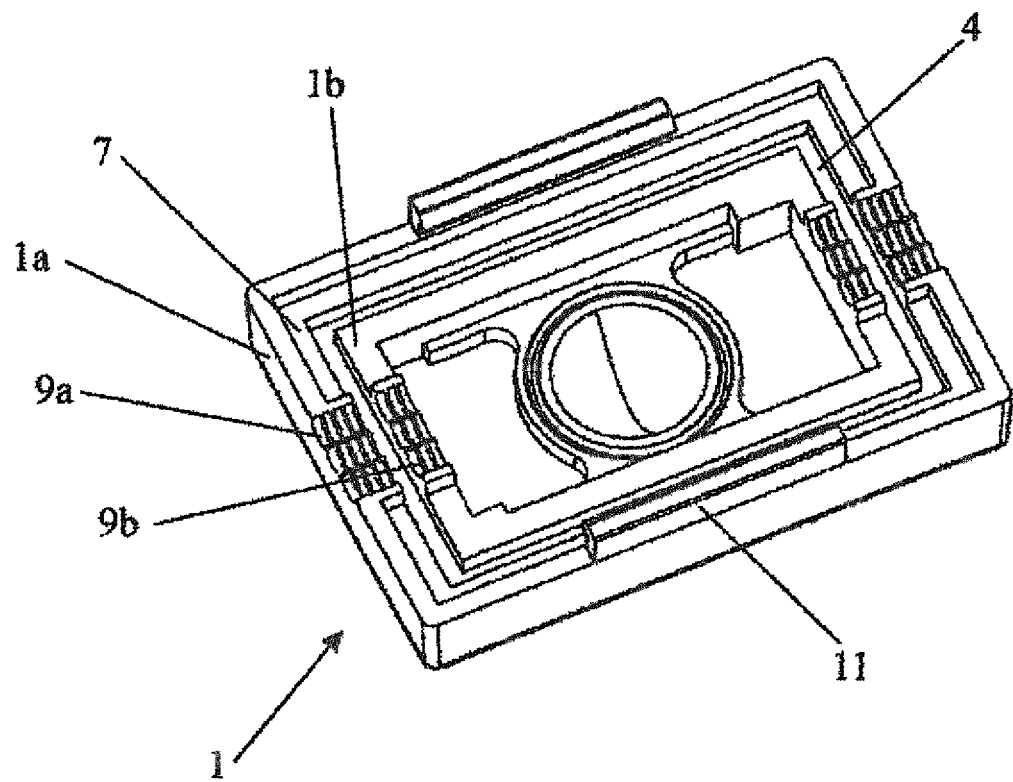
FIG. 2 is a perspective view of an upper housing of an encapsulation housing according to the present disclosure.
Figure 3:
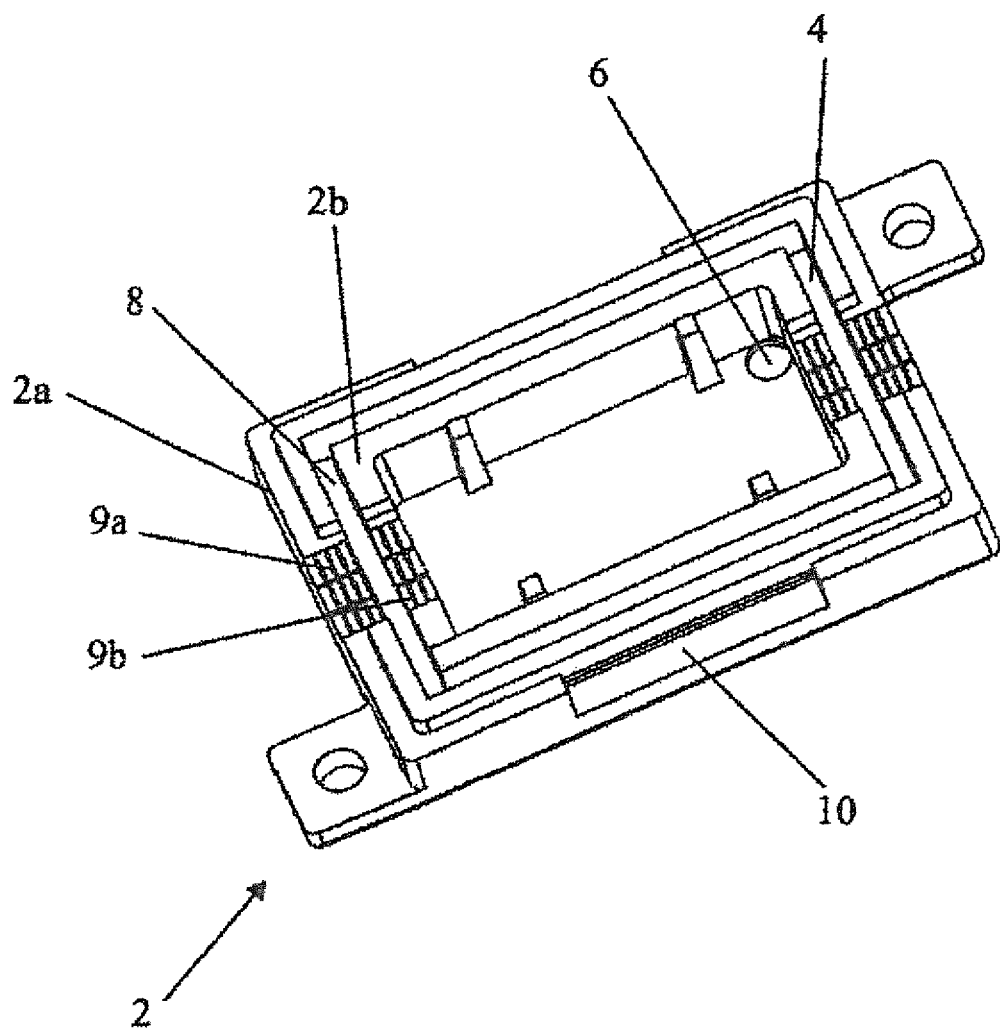
FIG. 3 is a perspective view of a lower housing of an encapsulation housing according to the present disclosure.

FIG. 2 is a perspective view of an upper housing 1 of an encapsulation housing according to the present disclosure, as can be seen from the figure, said upper housing 1 has the first bottom wall 12 in the middle of which there is provided a position for mounting a lens. In addition, said upper housing 1 is provided with the first lateral wall portion 1a extending from the first bottom wall 12 and encircling the edges of the first bottom wall 12 and the first inner partition wall portion 1b also extending from the first bottom wall 12 and along a direction in which the first lateral wall portion 1a extends and spaced thereapart. Likewise, FIG. 3 is a perspective view of a lower housing 2 of an encapsulation housing according to the present disclosure, as can be seen from the figure, said lower housing 2 is provided with the second lateral wall portion 2a extending from the second bottom wall 13 and encircling the edges of the second bottom wall 13 and the second inner partition wall portion 2b also extending from the second bottom wall 13 and along a direction in which the second lateral wall portion 2a extends and spaced thereapart. When the upper housing 1 and the lower housing 2 abut against each other, the first lateral wall portion 1a engages the second lateral wall portion 2a so as to constitute an enclosed cavity, moreover, the first inner partition wall portion 1b engages the second inner partition wall portion 2b so as to partition the enclosed cavity into the assembly cavity 3 and the anti-leakage cavity 4 encircling the assembly cavity 3. In addition, the potting hole 5 and the exhaust hole 6 respectively penetrating into the assembly cavity 3 are formed on the lower housing 2.

As can be seen from FIG. 2, the first lateral wall portion 1a is provided with a recess part 7, and as can be seen from FIG. 3, the second lateral wall portion 2a is provided with a protrusion part 8 shaped to adaptively engage the recess part 7. In addition, as can be seen from FIG. 2 and FIG. 3, recesses are formed on the contact surfaces of the first lateral wall portion 1a and the second lateral wall portion 2a; when the upper housing 1 and the lower housing 2 abut against each other, said recesses form a lateral wall guide wire hole 9a, and recesses are also formed on the contact surfaces of the first inner partition wall portion 1b and the second inner partition wall portion 2b; when the upper housing 1 and the lower housing 2 abut against each other, said recesses form a inner partition wall guide wire hole 9b.

In addition, the first lateral wall portion 1a of the upper housing 1 as shown in FIG. 2 has a fixing channel 10, and the second lateral wall portion 2a of the lower housing 2 as shown in FIG. 3 has a fixing hook 11 fixable into the fixing channel 10 for firmly connecting the upper housing 1 and the lowing housing 2 together.

The descriptions above are only preferable embodiments of the present disclosure and are not used to restrict the present disclosure. For those skilled in the art, the present disclosure may have various changes and variations. Any modifications, equivalent substitutions, improvements etc. within the spirit and principle of the present disclosure shall all be included in the scope of protection of the present disclosure.

LIST OF REFERENCE SIGNS 1 upper housing
2 lower housing
1a first lateral wall portion
2a second lateral wall portion
1b first inner partition wall portion
2b second inner partition wall portion
3 assembly cavity
4 anti-leakage cavity
5 potting hole
6 exhaust hole
7 recess part
8 protrusion part
9a lateral wall guide wire hole
9b inner partition wall guide wire hole
10 fixing channel
11 fixing hook
12 first bottom wall
13 second bottom wall
14 first anti-leakage surface
15 second anti-leakage surface
16 PCB board provided with LED chip
17 lower surface of assembly cavity

The invention claimed is:

1. An encapsulation housing for a LED module, having an upper housing and a lower housing joined together and defining together a cavity, wherein at least one of the upper housing and the lower housing has an inner partition wall partitioning the cavity into an assembly cavity and an anti-leakage cavity encircling the assembly cavity,
wherein the upper housing has a first bottom wall and the lower housing has a second bottom wall, the inner partition wall consists of a first inner partition wall portion extending from the first bottom wall and a second inner partition wall portion extending from the second bottom wall, and contact surfaces of the first inner partition wall portion and the second inner partition wall portion form a first anti-leakage surface extending from the assembly cavity to the anti-leakage cavity,
wherein at least one of the upper housing and the lower housing further has a lateral wall extending from the first bottom wall and/or the second bottom wall, such that the upper housing and the lower housing join together to form the cavity,
wherein the lateral wall consists of a first lateral wall portion formed on the upper housing and a second lateral wall portion formed on the lower housing, and contact surfaces of the first lateral wall portion and the second lateral wall portion form a second anti-leakage surface extending from the anti-leakage cavity to ambient environment,
wherein the second anti-leakage surface is higher than the first anti-leakage surface.

2. The encapsulation housing according to claim 1, wherein a potting hole and an exhaust hole respectively penetrating into the assembly cavity are formed on the second bottom wall of the lower housing.

3. The encapsulation housing according to claim 2, wherein the second anti-leakage surface is higher than a surface of bottom wall of the lower housing provided with the potting hole and the exhaust hole and defining the assembly cavity.

4. The encapsulation housing according to claim 2, wherein the first lateral wall portion or the second lateral wall portion is provided with a recess part, and the second lateral wall portion or the first lateral wall portion is provided with a protrusion part shaped to adaptively engage the recess part.

5. The encapsulation housing according to claim 1, wherein a lateral wall guide wire hole and an inner partition wall guide wire hole are formed on the lateral wall and the inner partition wall, respectively, and the lateral wall guide wire hole and the inner partition wall guide wire hole have a cross section corresponding to the cross section of the guide wire, respectively.

6. The encapsulation housing according to claim 5, wherein the lateral wall guide wire hole is formed by joining the recesses which are respectively formed on the contact surfaces of the first lateral wall portion and the second lateral wall portion, and the inner partition wall guide wire hole is formed by joining the recesses which are respectively formed on the contact surfaces of the first inner partition wall portion and the second inner portion wall portion.

7. The encapsulation housing according to claim 1, wherein the first lateral wall portion or the second lateral wall portion has a fixing channel, and the second lateral wall portion or the first lateral wall portion has a fixing hook fixable into the fixing channel.

8. An LED module, wherein the LED module has an encapsulation housing, having an upper housing and a lower housing joined together and defining together a cavity, wherein at least one of the upper housing and the lower housing has an inner partition wall partitioning the cavity into an assembly cavity and an anti-leakage cavity encircling the assembly cavity,
wherein the upper housing has a first bottom wall and the lower housing has a second bottom wall, the inner partition wall consists of a first inner partition wall portion extending from the first bottom wall and a second inner partition wall portion extending from the second bottom wall, and contact surfaces of the first inner partition wall portion and the second inner partition wall portion form a first anti-leakage surface extending from the assembly cavity to the anti-leakage cavity,
wherein at least one of the upper housing and the lower housing further has a lateral wall extending from the first bottom wall and/or the second bottom wall, such that the upper housing and the lower housing join together to form the cavity,
wherein the lateral wall consists of a first lateral wall portion formed on the upper housing and a second lateral wall portion formed on the lower housing, and contact surfaces of the first lateral wall portion and the second lateral wall portion form a second anti-leakage surface extending from the anti-leakage cavity to ambient environment, wherein the second anti-leakage surface is higher than the first anti-leakage surface.

9. The LED module according to claim 8, wherein a potting hole and an exhaust hole respectively penetrating into the assembly cavity are formed on the second bottom wall of the lower housing.

10. The LED module according to claim 9, wherein the second anti-leakage surface is higher than a surface of bottom wall of the lower housing provided with the potting hole and the exhaust hole and defining the assembly cavity.

11. The LED module according to claim 9, wherein the first lateral wall portion or the second lateral wall portion is provided with a recess part, and the second lateral wall portion or the first lateral wall portion is provided with a protrusion part shaped to adaptively engage the recess part.

12. The LED module according to claim 8, wherein a lateral wall guide wire hole and an inner partition wall guide wire hole are formed on the lateral wall and the inner partition wall, respectively, and the lateral wall guide wire hole and the inner partition wall guide wire hole have a cross section corresponding to the cross section of the guide wire, respectively.

13. The LED module according to claim 12, wherein the lateral wall guide wire hole is formed by joining the recesses which are respectively formed on the contact surfaces of the first lateral wall portion and the second lateral wall portion, and the inner partition wall guide wire hole is formed by joining the recesses which are respectively formed on the contact surfaces of the first inner partition wall portion and the second inner portion wall portion.

14. The LED module according to claim 8, wherein the first lateral wall portion or the second lateral wall portion has a fixing channel, and the second lateral wall portion or the first lateral wall portion has a fixing hook fixable into the fixing channel.

\* \* \* \* \*